United States Patent
Lee et al.

(10) Patent No.: US 7,816,271 B2
(45) Date of Patent: Oct. 19, 2010

(54) METHODS FOR FORMING CONTACTS FOR DUAL STRESS LINER CMOS SEMICONDUCTOR DEVICES

(75) Inventors: Kyoung Woo Lee, Suwon-si (KR); Ja Hum Ku, Seongnam-si (KR); WanJae Park, Hwaseong-si (KR); Chong Kwang Chang, Yongin-si (KR); Theodorus E. Standaert, Pine Bush, NY (US)

(73) Assignees: Samsung Electronics Co., Ltd., Suwon-Si (KR); International Business Machines Corporation, Armonk, NY (US)

( * ) Notice: Subject to any disclaimer, the term of this patent is extended or adjusted under 35 U.S.C. 154(b) by 473 days.

(21) Appl. No.: 11/778,039

(22) Filed: Jul. 14, 2007

(65) Prior Publication Data

US 2009/0017630 A1 Jan. 15, 2009

(51) Int. Cl.
*H01L 21/311* (2006.01)
(52) U.S. Cl. .................. 438/702; 438/761; 438/780
(58) Field of Classification Search ................ None
See application file for complete search history.

(56) References Cited

U.S. PATENT DOCUMENTS

| | | | |
|---|---|---|---|
| 6,309,960 B1 | 10/2001 | Sukekawa | |
| 6,573,172 B1 | 6/2003 | En et al. | |
| 7,521,763 B2* | 4/2009 | Kim et al. | 257/374 |
| 2008/0050869 A1* | 2/2008 | Sudo | 438/228 |
| 2008/0150033 A1* | 6/2008 | Greene et al. | 257/369 |
| 2008/0179638 A1* | 7/2008 | Dyer et al. | 257/288 |
| 2008/0217686 A1* | 9/2008 | Majumdar et al. | 257/347 |
| 2009/0014807 A1* | 1/2009 | Tang et al. | 257/369 |

FOREIGN PATENT DOCUMENTS

| | | |
|---|---|---|
| JP | 2000277610 | 10/2000 |
| JP | 200659982 | 3/2006 |
| JP | 200680161 | 3/2006 |
| JP | 200680161 T | 3/2006 |
| JP | 200659982 T | 3/2009 |
| KR | 10-0400173 | 10/2003 |
| KR | 10-0412195 | 12/2003 |
| KR | 10-2004-0033622 | 4/2004 |
| KR | 10-2004-0041252 | 5/2004 |

* cited by examiner

*Primary Examiner*—David E Graybill
(74) *Attorney, Agent, or Firm*—F. Chau & Associates, LLC

(57) ABSTRACT

Semiconductor fabrication methods to form a of via contacts in DSL (dual stress liner) semiconductor devices are provided, in which improved etching process flows are implemented to enable etching of via contact openings through overlapped and non-overlapped regions of the dual stress liner structure to expose underlying salicided contacts and other device contacts, while mitigating or eliminating defect mechanisms such as over etching of contact regions underlying non-overlapped regions of the DSL.

18 Claims, 8 Drawing Sheets

PRIOR ART

PRIOR ART

METHODS FOR FORMING CONTACTS FOR DUAL STRESS LINER CMOS SEMICONDUCTOR DEVICES

TECHNICAL FIELD OF THE INVENTION

The present invention relates generally to CMOS (complementary metal oxide semiconductor) fabrication techniques which incorporate improved process flows for formation of via contacts in DSL (dual stress liner) semiconductor devices and, in particular, semiconductor fabrication methods for etching via contact openings through DSL structures to expose underling salicided contacts and other device contacts in both overlapped and non-overlapped regions of a dual stress liner structures while mitigating or eliminating contact defect mechanisms such as over etching of device contact openings through non-overlapped regions.

BACKGROUND

In general, CMOS semiconductor devices include integrated circuits having complementary pairs of P-channel field-effect transistors and N-channel field-effect transistors formed on a common semiconductor substrate. As is generally known in the art, CMOS technologies are typically used to fabricate IC (integrated circuit) chips for high density and high-performance applications due to, e.g., the high operation efficiency, high switching speed, and good scaling properties that are characteristic of CMOS devices. Technological innovations in semiconductor fabrication technologies are driving market demands for CMOS solutions for higher speed, higher integration density, and lower power applications. The downscaling of CMOS technologies to submicron design rules and beyond, however, poses technological challenges with respect to maintaining performance and reliability. For example, as device sizes are downscaled, CMOS transistors must be formed with, e.g., thinner gate electrodes, smaller channel lengths, and shallower drain/source extension diffusion regions. This downscaling generally results in transistors having higher channel resistance and higher junction/contact parasitic resistances, leading to degraded performance. To mitigate the impact on device performance with downscaling, various state of the art CMOS fabrication techniques can be implemented to effectively reduce parasitic gate and junction resistances and increase channel conductivity.

For example, DSL (dual stress liner) techniques can be incorporated in CMOS process flows as a means to enhance performance of highly-scaled CMOS devices. In general, DSL technologies are premised on findings that the application of a sufficient compressive stress to the conduction channel of a P-type transistor can improve the carrier (holes) mobility within the channel, while the application of a sufficient tensile stress to the conduction channel of an N-type transistor can improve the carrier (electrons) mobility within the channel. In this regard, various DSL techniques that have been developed to improve device performance by forming a compressive stress insulating liner over the gate structure of P-type transistors while forming tensile stress insulating liners over the gate structures of N-type transistor devices, for the purposes of increasing the charge carrier mobility in the transistor channels.

FIG. 1 is a cross-sectional schematic view of a dual stress liner CMOS device having a conventional framework. FIG. 1 illustrates a CMOS semiconductor device (100) having NMOS and PMOS transistor structures (110) and (120) formed in respective active regions (102) and (103) on an active surface of a semiconductor substrate (101). The active regions (102) and (103) are defined and separated by an isolation structure (104) (e.g., STI (shallow trench isolation) structure). In the illustrative embodiment, the active region (102) is defined by a portion of a P-type substrate layer (101a) and the active region (103) comprises an N-type device well (101b) formed in the P-type substrate layer (101a). The NMOS transistor (110) comprises a gate structure (111) formed on the substrate surface in the active region (102), as well as n-doped drain/source diffusion regions (16) formed in the p-type substrate layer (101a). Similarly, the PMOS transistor (120) comprises a gate structure (121) formed on the substrate surface in the active region (103), as well as p-doped drain/source diffusion regions (16) formed in the N-well (101b). The source/drain regions (16) of the transistors (110) and (120) include metal silicide contact regions (17).

The gate structures (111) and (121) have similar structures, each comprising a polysilicon (poly-Si) gate electrode (11/12/13) formed of stacked layers including a dielectric layer (11), a polysilicon layer (12) and a metal silicide layer (13). Moreover, the gate structures (111) and (121) each have thin L-shaped sidewall insulating spacer layers (14) formed on the sidewalls of the gate electrodes (11/12/13) and a portion of the surface of the active silicon regions adjacent the sidewalls. A polyconductor structure (131) is formed over the isolation region (104), which comprises a polysilicon layer (12') and metal silicide layer (13') similar to the gate structures (111) and (121). As is known in the art, the polyconductor structure (131) may be part of an electrical interconnection that is formed simultaneously and integrally with the gate structures (111) and (121), which serves to connect the gate electrodes of the complementary transistor pairs (110) and (120), for example.

Further, different stress-imparting insulating films (140, 160) are formed over the active surface of the semiconductor substrate (101) to form a DSL structure that imparts appropriate stresses to enhance the channel conductivity of the CMOS transistors (110) and (120). The stress films (140) and (160) may be formed using a conventional dual stress liner process flow in which two different nitrides films 140 and 160 are formed using separate lithographic patterning steps. For example, in the embodiment of FIG. 1, a tensile nitride film (140) and thin oxide layer (150) can be sequentially deposited over the active surface of the substrate (101) and then patterned to remove those portions of the films (140) and (150) that cover the PMOS region (103). Thereafter, a compressive nitride film (160) can be deposited over the active surface of the substrate and then patterned to remove that portion of the compressive nitride film (160) that covers the NMOS region (102), wherein the oxide layer (150) as an etch stop layer.

The various DSL structure layers (140), (150) and (160) may be formed in a manner, such as depicted in FIG. 1, such that the compressive stress liner (160) overlaps the tensile nitride liner (140) and oxide layer (150). In particular, FIG. 1 illustrates an embodiment where an overlapped region (105) of the stress liners (140/150/160) is located in the isolation region (104) over the polyconductor structure (131). The overlapped region (105) is formed to ensure that there is no gap between the two liner materials (140) and (160). In the illustrative embodiment of FIG. 1, the stress liner layers (140) and (160) are depicted as having the same thickness $t_1$ (e.g., 600 angstroms) and the layer (150) is depicted as having a thickness, $t_2$ (e.g., 100 angstroms). In this regard, the dual stress liner structure has non-uniform thickness in different regions, wherein the DSL structure has a thickness of $t_1+t_2$ in the active region (102), a thickness of $t_1$ in the active region (103) and a thickness $2t_1+t_2$ in the overlapped region (105).

The non-uniform thickness of the DSL structure may be problematic with regard to subsequent processing steps.

For example, the non-uniformity in thickness of the DSL structure may cause problems during subsequent BEOL processing when etching contact via holes through the different regions (overlapped and non-overlapped regions) of the DSL structure to form contacts to underlying polysilicon contact regions (13), (13') and (17). In some conventional techniques, a reactive ion etch (RIE) process is used to concurrently etch openings in the DSL layers to expose the metal silicide regions (13), (13') and (17) in both the overlapped region (105) and non-overlapped regions of the DSL layers. To accommodate for the non-uniform thickness of the DSL layers, an over-etch RIE process is performed to ensure that a contact opening is sufficiently formed in the overlapped region (105) to expose the underlying metal contact (13'). Such over-etching, however, can cause damage to and/or erosion of the metal silicide regions (13, 17) that are exposed during the via contact etch in the non-overlapped regions of the DSL structure. This conventional process and the associated defect mechanisms will be explained in further detail with reference to FIG. 2.

FIG. 2 schematically illustrates a stage of BEOL fabrication where an ILD (interlayer dielectric) layer (200) is been formed over the active surface of the semiconductor device of FIG. 1, and where a plurality of contact holes (201)~(204) are formed through the ILD layer (200) to some of the silicide contacts (13) and (17) of the transistors (110) and (120) in non-overlapped regions of the DSL layers (140/150) and (160) and to the silicide contact (13') in the overlapped region (105) of the DSL layers. In general, the contact holes (201)~(204) can foe formed by a first etch process to form contact holes in the ILD layer (200) down to the respective stress liners (140) and (160) using an conventional RIE etch process with an etch chemistry that etches the materials of the ILD layer (200) and liner layer (150) (e.g., oxides) selective to stress liner material (e.g., nitride), whereby the stress layers (140, 160) used as etch stops. Thereafter, a second etch process is performed to concurrently etch the portions of the stress liner layers (140/150) and (160) that are aligned with, and exposed through, the respective via holes (201)~(204) down to the underlying silicide regions (13, 13' and 17). The second etch process can be performed using an conventional RIE etch process with an etch chemistry that etches the materials of the liner layers (140/150) and (160) selective to of the ILD layer (200), wherein the underlying silicide regions (13, 13' and 17) are used as etch stops.

Due to the variation in the total thicknesses of the overlapped region (105) and non-overlapped regions of the DSL layers, the second etch process must foe performed for a sufficient amount of time so that the contact hole (204) is appropriately etched through ail stress liner layers (160-150-140) to expose the silicide layer (13') of the polysilicon conductor (131), otherwise a contact open failure can result. In other words, in the conventional process, the RIE etch is performed based on thicker portion of the DSL in the overlapped region (105) (i.e., the combined thickness of the stress layers (140/150/160)), as compared to the thinner portion of the DSL in the non-overlapped. In this regard, while the second etch process is performed to extend the contact holes through the DSL layers to the silicide contacts (13, 13' and 17), the contact holes (201), (202) and (203) in the non-overlapped regions of the DSL layers will be etched down to the silicide contacts (135 and (17) before the contact hole (204) in the overlapped region (105) is etched to expose the silicide contact (13'). Consequently, while the etch process is continued to sufficiently etch the contact hole (204) to the silicide layer (13') in the overlapped region (105), the exposed silicide contacts (13) and (17) in the contact holes (210, 202 and 203) can be damaged from exposure to the etching environment. For instance, FIG. 2 illustrates one possible defect mechanism in which the thin silicide contact layers 13 and 17 at the bottom of the contact holes (201, 202, and 203) are significantly over-etched. In other instances, severe over etching can result in defects such as punch through the silicide contact layers (13) and (17) or unwanted residual material, all of which causing higher resistance contact interfaces between device contacts and the metal plugs subsequently formed in the contact holes during later stages of BEOL fabrication.

SUMMARY OF THE INVENTION

Exemplary embodiments of the invention generally include semiconductors fabrication techniques for forming via contacts in DSL (dual stress liner) semiconductor devices using improved etching process flows that enable etching of via contact openings through overlapped and non-overlapped regions of the dual stress liner structure to expose underlying salicided contacts and other device contacts, while mitigating or eliminating defect mechanisms such as over etching of contact regions underlying non-overlapped regions of the DSL.

In one exemplary embodiment, a method is provided as part of a semiconductor fabrication process for dual stress liner semiconductor devices. The method includes forming a DSL (dual stress liner) structure on an active surface of a semiconductor substrate having first and second device regions, wherein the DSL structure comprises first and second stress liner layers formed over the first and second device regions. The DSL structure comprises an overlapped region in which a portion of the second stress liner layer overlaps a portion of the first stress liner layer at an interface between the first and second stress liner layers, and a non-overlapped region in which portions of the first and second stress liner layers are not overlapped. An insulating layer is formed over the DSL structure and a pattern of partial via holes is formed in the insulating layer down to the DSL structure. The pattern of partial via holes is formed to include partial via holes that extend to the first or second stress liner layers in the non-overlapped region of the DSL structure and partial via holes that extend to the second stress liner layer in the overlapped region of the DSL structure. An etching process is performed to selectively etch portions of the second stress liner layer exposed through the partial via holes in the overlapped region of the DSL structure to extend the partial via holes in the overlapped region down to the underlying first stress liner, and concurrently etch portions of the first and second stress liner layers exposed through the partial via holes in the overlapped and non-overlapped regions of the DSL structure to form via contact holes that extend to underlying via contact regions.

In one exemplary embodiment, a process of selectively etching portions of the second stress liner layer exposed through the partial via holes in the overlapped region of the DSL structure includes depositing sacrificial material to cover portions of the first or second stress liner layers exposed at the bottom of the partial via holes in the non-overlapped region of the DSL structure, and anisotropically etching the portions of the second stress liner layer exposed through the partial via holes in the overlapped region of the DSL structure using an etch chemistry in which the exposed portions of the second stress liner layer at the bottom of the partial via holes in the overlapped region is etched selective to the sacrificial material in the partial via holes in the non-overlapped region.

The sacrificial material may be an organic material or an inorganic material, such as an organic BARC (bottom anti reflection coating) material or photoresist material, or an inorganic BARC material.

In another exemplary embodiment, the first or second stress liner layers exposed at the bottom of the partial via holes in the non-overlapped region of the DSL structure are covered with sacrificial material by depositing a layer of sacrificial material over the insulating layer to fill the partial via holes in both overlapped and non-overlapped regions of the DSL structures with the sacrificial material, and etching back the layer of sacrificial material to a depth sufficient to remove the sacrificial material within the partial via holes in the overlapped region of the DSL structure. The etching back the layer of sacrificial material can be performed using a dry etch process with an etch chemistry that etches the sacrificial material selective to the material of the first and second stress liner layers.

In other exemplary embodiments of the invention, the overlapped region of the DSL structure is disposed over an isolation region between the first and second device regions, and the partial via holes formed in the insulating layer in the overlapped region of the DSL structure are aligned to underlying via contact regions of a silicided polysilicon line formed on the isolation layer. The partial via holes in the insulating layer in the non-overlapped region of the DSL structure may be aligned to underlying via contact regions of silicided diffusion regions or polysilicon gate electrodes of transistor devices underling the first and second stress liner layers formed overlying the first and second device regions.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
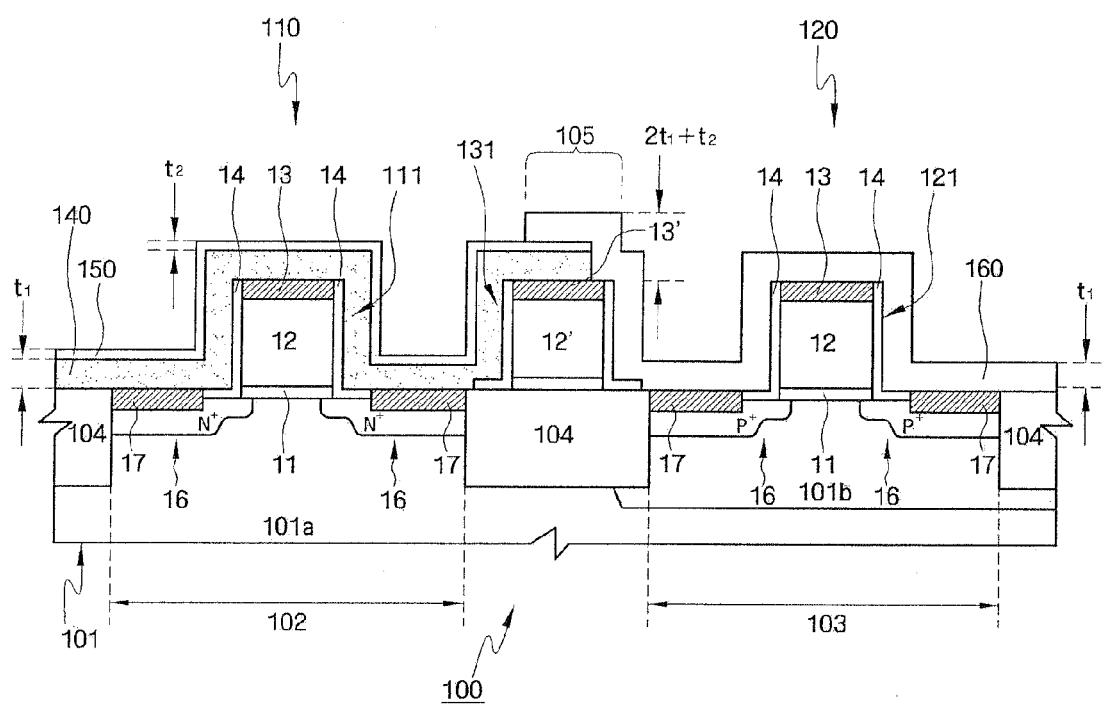
FIG. 1 is a cross-sectional schematic view of a dual stress liner CMOS device having a conventional framework.

Exemplary embodiments of the invention will now be described more fully with reference to the schematic illustrations in the accompanying drawings in which it is to be understood that the thickness and dimensions of the layers and regions are exaggerated for clarity. It is to foe further understood that when a layer is described as being "on" or "over" another layer or substrate, such layer may be directly on the other layer or substrate, or intervening layers may also be present. Moreover, similar reference numerals that are used throughout the drawings are used to denote elements that are the same or similar or having the same or similar functions.

Figure 2:
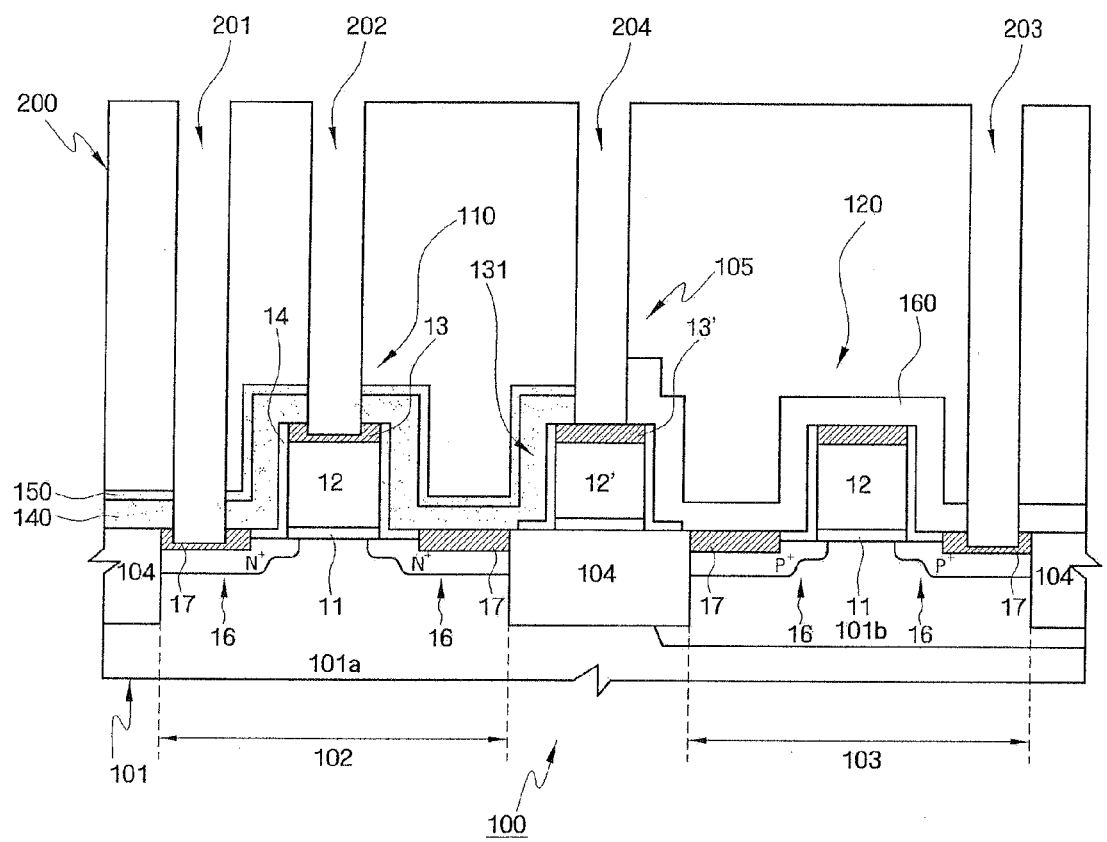
FIG. 2 schematically illustrates defect mechanisms that are associated with conventional method for etching contact holes in overlapped and non-overlapped regions of a DSL CMOS device such as depicted in FIG. 1.

FIGS. 3A~3F schematically illustrate a method for forming via contacts in dual stress liner CMOS devices having overlapped stress liners according to an exemplary embodiment of the invention. For purposes of illustration, FIGS. 3A~3F depict an exemplary method for forming via contacts for a dual stress liner CMOS device as illustrated in FIG. 1, which allows via contact openings to be formed to underlying silicide contacts (13, 13' 17) in overlapped and non-overlapped regions of the different stress liners (140) and (160), while mitigating or otherwise eliminating the defect mechanisms discussed above with reference to FIG. 2.

Figure 3A:
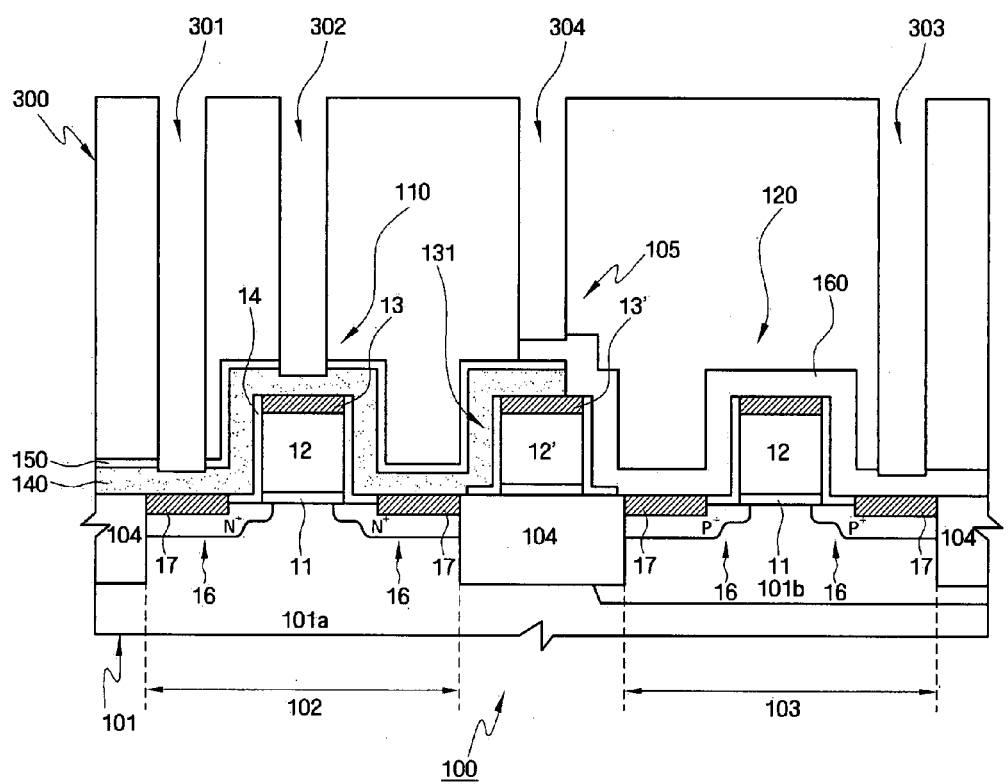
FIGS. 3A~3F schematically illustrate a method for forming via contacts in dual stress liner CMOS devices having overlapped stress liners according to an exemplary embodiment of the invention.

FIG. 3A schematically illustrates an initial stage of an exemplary via formation process where an ILD (interlayer dielectric) layer (300) is formed over a DSL structure comprising a first stress liner layer (140) and a second stress liner layer (160) formed over a first device region (102) and second device region (103), respectively. The DSL structure comprises an overlapped region (105) in which a portion of the second stress liner layer (160) overlaps a portion of the first stress liner layer (140) at an interface between the first and second stress liner layers. The DSL structure comprises a non-overlapped region in which portions of the first and second stress liner layers (140) and (160) are not overlapped with each other (e.g., a non-overlapped portion of the first stress liner layer (140) that is formed over the first device region (102) and a non-overlapped portion of the second stress liner layer (160) that is formed over the second device region (103). In the exemplary embodiment, the DSL structure further comprises a thin insulating layer (150) formed over the stress liner layer (140), which may be an oxide layer (e.g., LTO) formed on the first stress liner layer (140) to serve as an etch stop layer in a known DSL processing techniques in which the portion of the second stress liner layer (160) deposited in the first device region (102) is removed via an etch process.

FIG. 3A further depicts a plurality of contact holes (301)~(304) formed through the ILD layer (300) to some of the silicide contacts (13) and (17) of the transistors (110) and (120) in non-overlapped regions of the DSL layers (140/150) and (160) and to the silicide contact (13') in the overlapped region (105) of the DSL layers. In the exemplary embodiment of FIG. 3A, the partial via holes (301) and (302) are etched down to locations along the non-overlapped region of the stress liner (140) that are aligned to silicide contact regions (17) and (13) of the NMOS transistor (110). Further, the partial via hole (303) is etched down to a location along the non-overlapped region of the stress liner (160) that is aligned to the silicide contact region (17) of the PMOS transistor (120). Moreover, the partial vial hole (304) is etched down to the upper stress liner layer (160) in the overlapped region of the stress liners (140/150, 160) aligned to the silicide layer (13') of the polyconductor (131).

The structure of FIG. 3A may be formed by depositing one or more layers of dielectric/insulating materials, such as silicon dioxide or low-k dielectric materials, to form the ILD layer (300) using known techniques. Although the ILD layer (300) is depicted in FIG. 3A as a single layer, it is to be understood that ILD layer (300) may be formed of multiple layers, e.g., a first layer of SiO2 (or a low-k dielectric) deposited over the active surface of the substrate (101), a second thin silicon nitride layer (etch stop layer) and another layer of SiO2 (or a low-k dielectric layer) deposited over the etch stop layer.

Following formation of the ILD layer (300), the partial via holes (301)~(304) may be formed using conventional lithographic and etch techniques. For instance, a lithographic process may be implemented to form a photoresist etch mask over the ILD layer (300) having openings that define the via hole pattern. Thereafter, one or more etch processes may foe performed using the photoresist pattern as an etching mask to etch the partial via holes (301~304) down to the respective stress liner layers (140) and (160). The ILD layer (300) may be etched using any conventional etch process, such as an anisotropic dry oxide etch process (e.g., reactive ion etching) having a suitable etch chemistry to etch the material of the ILD layer (300) highly selective to the material (e.g., nitride) of the stress liners (140) and (150) which function as etch distinguishable layers. The high etching selectivity is used to enable long over etching of the ILD layer (300) to account for the different depths to which the partial via holes must be etched to reach the stress liner layers (140) and (160).

Depending on the materials forming the ILD layer (300) and stress liner layer (150), the thin liner layer (150) may or may not be etched using the same etch chemistry for etching the ILD layer (300). If a separate etch is used to etch the thin liner layer (150), such etching is performed selectivity to the stress liner layers (140) and (160). As shown in FIG. 3A, the etching results in a structure in which the partial via holes 301~304 are etched to sufficient depths that terminate at, or slightly below, the surface of the underlying stress liner layers (140) or (160) exposed at the base of respective partial contact openings.

Figure 3B:
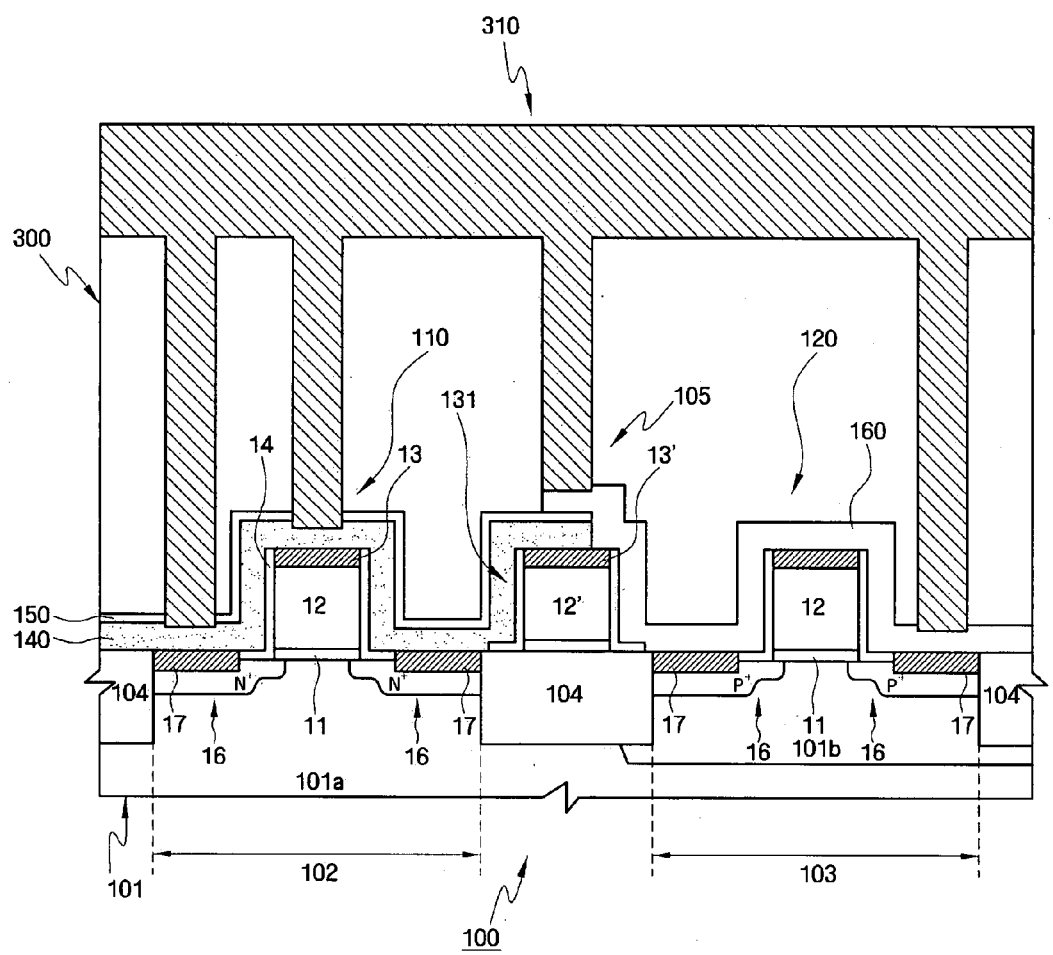

Following formation of the partial via holes (301~304), the photoresist pattern is removed using, e.g., an ashing process (O2 or H2 plasma) and organic stripper. A layer of sacrificial material (310) is deposited to fill the partial via holes (301~304), as depicted in FIG. 3B. The thickness of the sacrificial material layer (310) that is formed over the active surface of the substrate (101) will vary depending on the sacrificial material and the critical dimensions, depths and density of the partial via holes. In one exemplary embodiment of the invention the layer of sacrificial material (310) is formed of an organic material such as a BARC (bottom anti-reflective coating) material or a photoresist material or other suitable organic materials having sufficient via filling properties. By way of specific example, the sacrificial material (31) may be a polymeric organic BARCs that is deposited via spin-on polymeric materials (e.g., spin-on-glass (SOG) material). Polymeric organic BARCs typically have good gap-fill and polarization properties. In other embodiments, the sacrificial material (310) may foe formed of an inorganic material such as an inorganic BARC material. The type of sacrificial material used (organic, inorganic, etc) will varying depending on the material that forms the ILD layer (300) and the desired etch selectivity between the ILD layer (300), the sacrificial material (310), the stress liner layers (140), (160), etc., as understood by one of ordinary skill in the art.

Figure 3C:
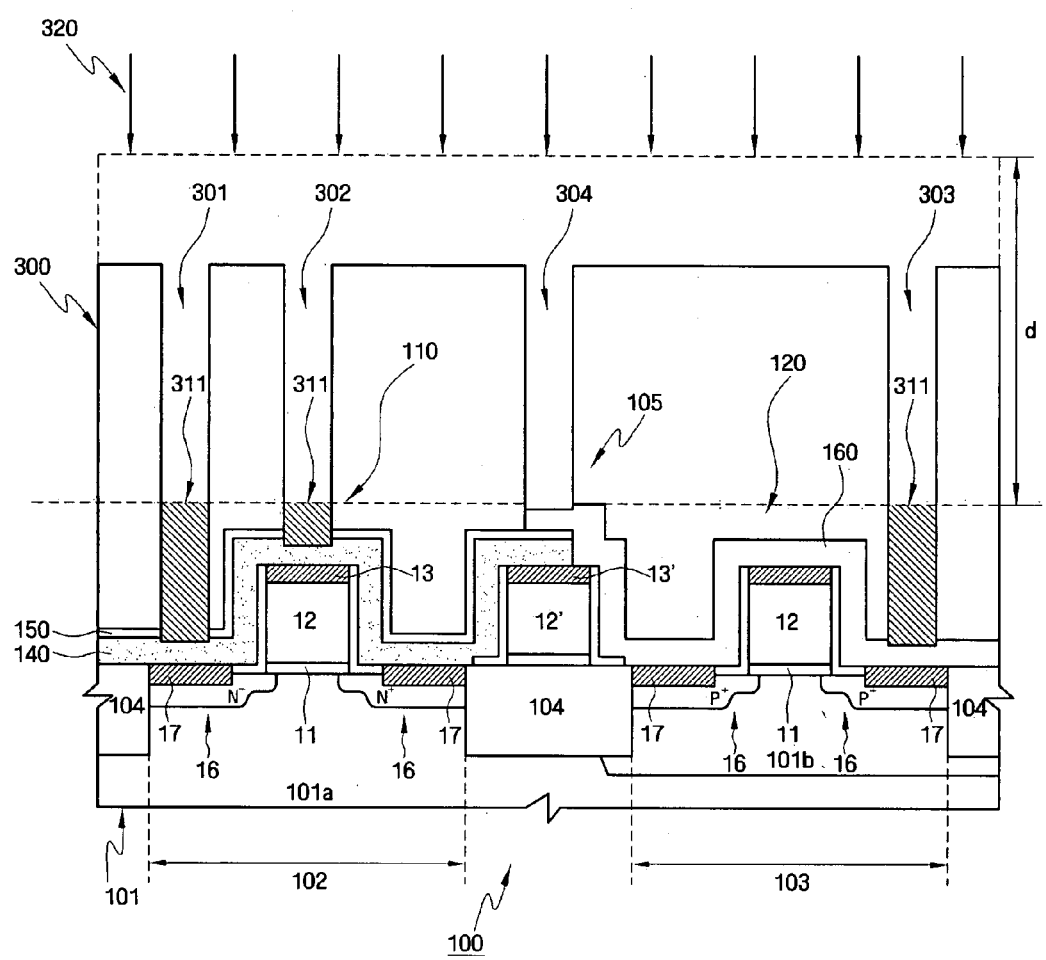

Referring to FIG. 3C, after deposition of the sacrificial material (310), an etch-back process (320) is performed to etch the layer sacrificial material (310) to remove the sacrificial material from the partial via hole (304) in the overlapped region (105) while leaving the partial via holes (301~303) in the non-overlapped regions partially filled with sacrificial material (311). As depicted in FIG. 3C, the etch process (320) is performed to etch the sacrificial material (310) in the partial via holes (301~304) down to a depth d to expose the stress liner (160) in the overlapped region (105). The etch back process can be performed using known techniques. The process may be performed by etching/removing the sacrificial layer (310) (e.g., BARC) down to the surface of the ILD layer (300) (which may have a silicon nitride mask layer formed thereon), which is used as an etch end point detection, which is then followed by a timed over-etch (e.g., RIE) to etch down the sacrificial material in the partial via holes (301~304) down to a depth d of the partial via hole (304) in the overlapped regions (e.g., perform over etch process based on known parameters of etch rate and depth d). The etch process (320) may be performed using an anisotropic RIB process with an etch chemistry sufficient to etch the sacrificial material (310) selective to the ILD material (300) and the stress liners (140, 160) (e.g., silicon nitride). For example, an organic BARC can be etched in an oxygen-based, or fluorocarbon based plasma gases. A conventional ashing process can be used to perform the etch back of an organic BARC fill material.

Following the etch back process of FIG. 3C, one or more etch processes (330) are performed to etch the exposed portions of the stress liner (160) and thin liner layer (150) at the bottom of the partial via hole (304) in the overlapped region (105) down to the underlying of the stress liner layer (140). During the etch process (320) of FIG. 3D, the sacrificial material (311) remaining in the bottom of partial via holes (301~303) protects the stress liners (140) and (160) in the non-overlapped regions from being etched. In one exemplary embodiment of the invention where a thin liner layer (150) of oxide (e.g., LTO) is present, an RIE process may foe performed to etch the nitride material of the stress liner layer (160) using an etch chemistry selective to the sacrificial material (311) and the thin layer (150), where the thin liner layer (150) is used as an etching end point. The thin liner layer (150) can then be selectively etched via RIE down to the underlying stress liner layer (140). In another exemplary embodiment of the invention where the thin layer (150) is not used, the exposed portion of the stress liner layer (160) at the bottom of the partial via hole (304) can be selectively etched down to the underlying stress liner layer (140) using a timed etch (and known etch rate).

Figure 3D:
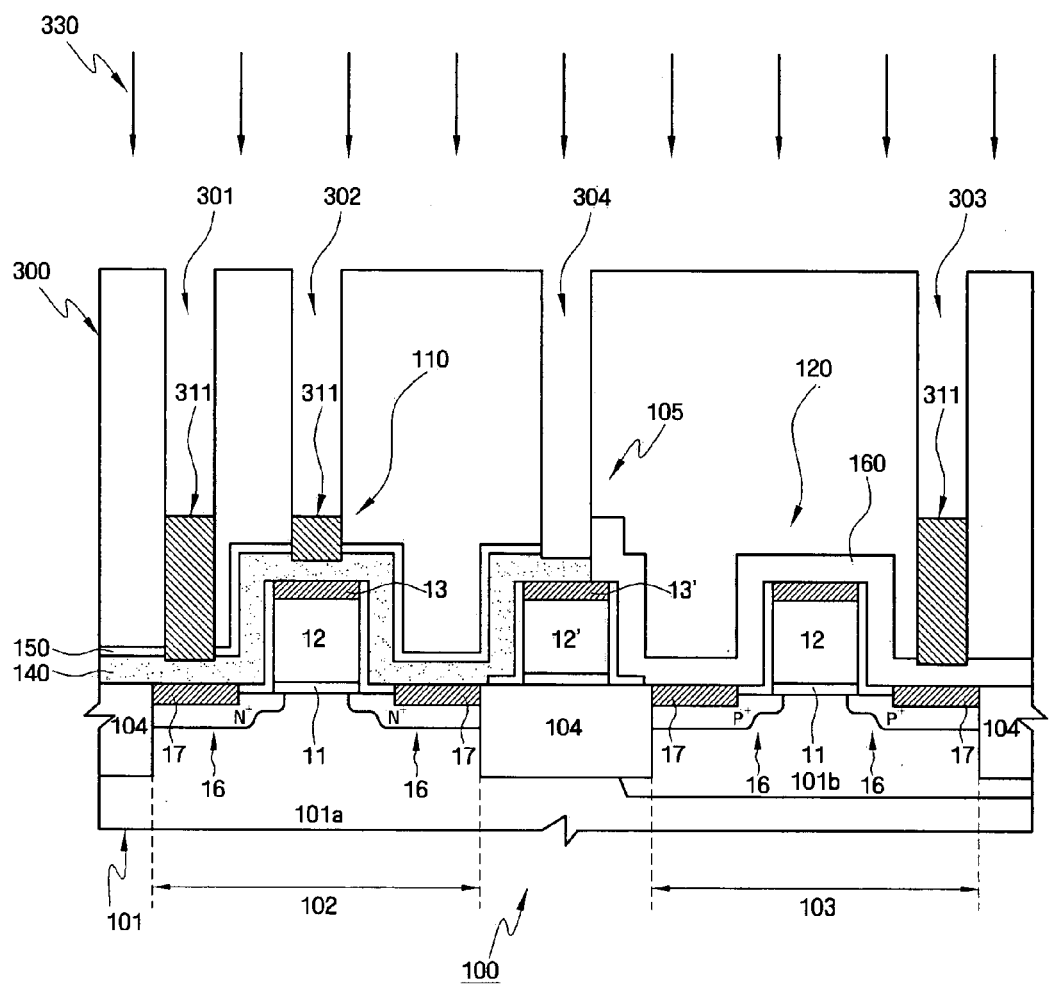

In the resulting structure of FIG. 3D, the partial via hole (304) in the overlapped region (105) is further recessed down to, or just below, the surface of the underlying stress liner layer (140). In this immediate stage, the bottoms of each of the partial via holes (310~304) in the overlapped and non-overlapped regions are disposed substantially at the same distance from respective target silicide contact layers (13, 13' 17).

Figure 3E:
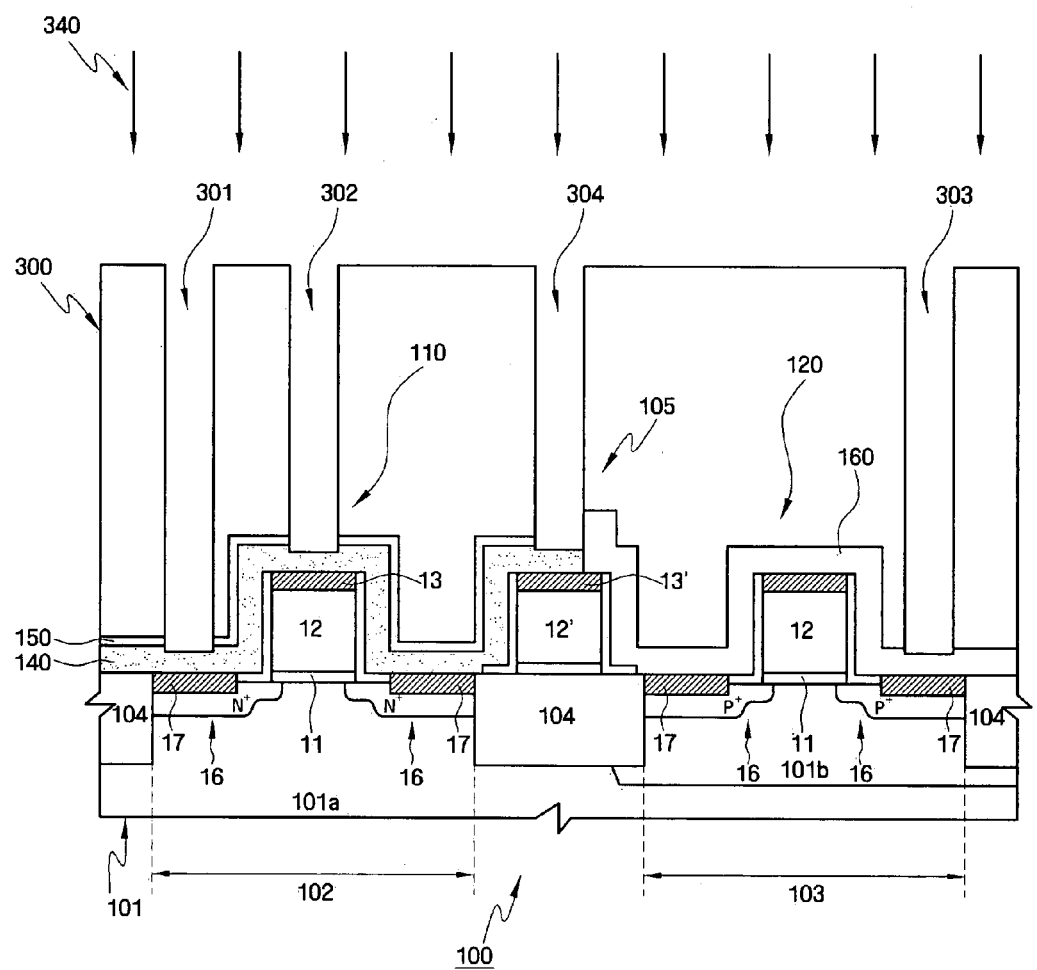

Referring to FIG. 3E, an etch process (340) is performed to remove the remaining portion of the sacrificial material (311) at the bottoms of the partial via holes (301, 302, 303) in the non-overlapped regions of the stress liner layers (140), (160). In one embodiment where the sacrificial material (311) is formed of an organic BARC or photoresist material, an oxygen ashing process may be used to remove the sacrificial material (311) selective to the material of the stress liner layers (140), (160). If the sacrificial material (311) is formed of an inorganic material, a wet etch process may be used where the etchant solution has a high selectivity to the materials of the ILD layer (300) and the stress liners (140) and (160). Whether an organic or inorganic sacrificial material is used will depend on the material that forms the ILD layer (300) and the desired etch selectivity between the ILD layer (300), the sacrificial material (310), the stress liner layers (140), (160), etc., for the given etch chemistries.

Figure 3F:
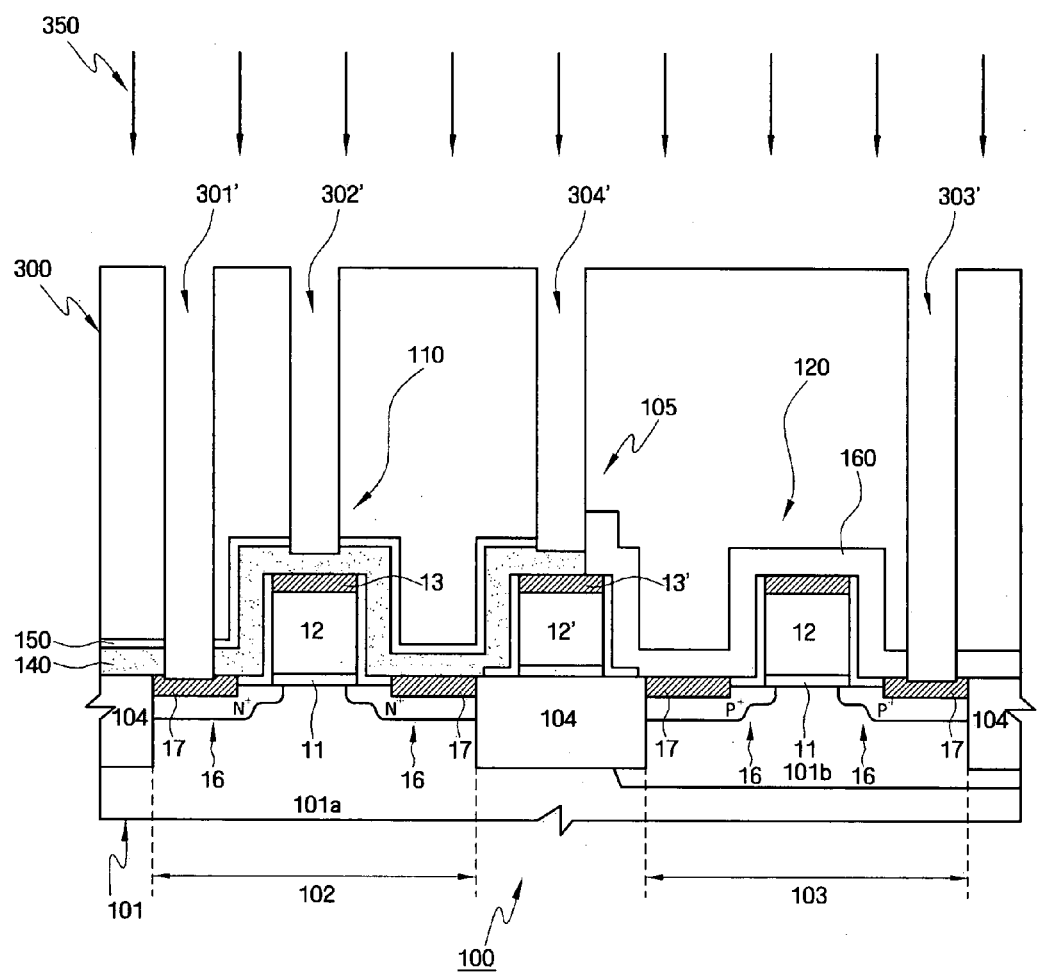

Referring to FIG. 3F, following removal of the sacrificial material (311), an etch process (350) is performed to etch away the exposed portions of the stress liners (140) and (160) at the bottom of the partial via holes (301~304) in both the non-overlapped and overlapped regions of the stress liners, which results in the final via hole openings (301'~304') that fully extend through the overlapped and non-overlapped regions of the DSL structure to expose respective silicide contact windows. In one embodiment, the etch process is using an anisotropic RIE having a suitable etching chemistry to selectively etch the materials forming the stress liner layers (140), (160) (e.g., silicon nitride). Since the bottoms of each of the partial via holes (310~304) in the overlapped and non-overlapped regions are disposed substantially at the same distance from respective target silicide contact layers (13, 13' 17) prior to the etch process, the etch process (350) can be performed concurrently in both the overlapped and non-overlapped regions without resulting in undesired over-etching of the exposed silicide contact layers such that the etch process is expected to terminate at, or slightly below, the surface of silicide layers (13, 13' and 17) exposed at the base of the resulting via contact holes (301'~304').

At later stages of fabrication following FIG. 3F, the via holes (301'~304') can be subsequently filled with metallic material using any suitable BEOL metallization process. For instance, the via holes (301'~304') can be filled with a metallic material, such as tungsten (W) to form the contact plugs in the ILD layer (300) that serve as electrical contacts between the FEOL silicide contacts and metal wiring/pads of a first metallization level. As is known in the art, deposition of W via CVD (chemical vapor deposition) process allows high-aspect ratio via holes to be uniformly filled. One or more thin barrier/seed layers (e.g., titanium (Ti) or titanium nitride (TiN)) may be deposited to line the inner surfaces of the via openings (301'~304') prior to metallic filling, as is known in the art. Other BEOL metallization methods such as single damascene or dual damascene methods can be used for constructing back end metallization and interconnects starting from the intermediate processing stage as illustrated in FIG. 3F. For example, the exemplary processes described with reference to FIGS. 3A~3F may be incorporated as initial stages of what is known as a "via-first" dual damascene BEOL process.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A method for fabricating a semiconductor device, comprising:

forming a DSL (dual stress liner) structure on an active surface of a semiconductor substrate having first and second device regions, wherein the DSL structure comprises first and second stress liner layers formed over the first and second device regions, respectively, the DSL structure comprising an overlapped region in which a portion of the second stress liner layer overlaps a portion of the first stress liner layer at an interface between the first and second stress liner layers, and wherein the DSL structure comprise a non-overlapped region in which portions of the first and second stress liner layers are not overlapped;

forming an insulating layer over the DSL structure;

forming a pattern of partial via holes in the insulating layer down to the DSL structure, the pattern of partial via holes including partial via holes that extend to the first or second stress liner layers in the non-overlapped region of the DSL structure and partial via holes that extend to the second stress liner layer in the overlapped region of the DSL structure;

selectively etching portions of the second stress liner layer exposed through the partial via holes in the overlapped region of the DSL structure to extend the partial via holes in the overlapped region down to the underlying first stress liner; and concurrently etching portions of the first and second stress liner layers exposed through the partial via holes in the overlapped and non-overlapped regions of the DSL structure to form via contact holes that extend to underlying via contact regions;

wherein selectively etching portions of the second stress liner layer exposed through the partial via holes in the overlapped region of the DSL structure comprises:

depositing sacrificial material to cover portions of the first or second stress liner layers exposed at the bottom of the partial via holes in the non-overlapped region of the DSL structure; and anisotropically etching the portions of the second stress liner layer exposed through the partial via holes in the overlapped region of the DSL structure using an etch chemistry in which the exposed portions of the second stress liner layer at the bottom of the partial via holes in the overlapped region is etched selective to the sacrificial material in the partial via holes in the non-overlapped region.

2. The method of claim 1, wherein the sacrificial material is an organic material.

3. The method of claim 1, wherein the sacrificial material is an inorganic material.

4. The method of claim 1, wherein the sacrificial material is a BARC material.

5. The method of claim 1, wherein depositing sacrificial material to cover portions of the first or second stress liner layers exposed at the bottom of the partial via holes in the non-overlapped region of the DSL structure comprises:

depositing a layer of sacrificial material over the insulating layer to fill the partial via holes in both overlapped and non-overlapped regions of the DSL structures with the sacrificial material, and etching back the layer of sacrificial material to a depth sufficient to remove the sacrificial material within the partial via holes in the overlapped region of the DSL structure.

6. The method of claim 5, wherein etching back the layer of sacrificial material is performed using a dry etch process with an etch chemistry that etches the sacrificial material selective to the material of the first and second stress liner layers.

7. The method of claim 1, wherein the overlapped region of the DSL structure is disposed over an isolation region between the first and second device regions.

8. The method of claim 7, wherein the partial via holes formed in the insulating layer in the overlapped region of the DSL structure are aligned to underlying via contact regions of a silicided polysilicon line formed on the isolation layer.

9. The method of claim 1, wherein the partial via holes in the insulating layer in the non-overlapped region of the DSL structure are aligned to underlying via contact regions of silicided diffusion regions or polysilicon gate electrodes of transistor devices underling the first and second stress liner layers formed overlying the first and second device regions.

10. A method for fabricating a semiconductor device, comprising:

forming a DSL (dual stress liner) structure on an active surface of a semiconductor substrate having first and second device regions, wherein the DSL structure comprises first and second stress liner layers formed over the first and second device regions, respectively, the DSL structure comprising an overlapped region in which a portion of the second stress liner layer overlaps a portion of the first stress liner layer at an interface between the first and second stress liner layers, and wherein the DSL structure comprise a non-overlapped region in which portions of the first and second stress liner layers are not overlapped;

forming an ILD (interlevel dielectric) layer over the DSL structure;

concurrently etching partial via holes through the ILD layer to the underlying DSL structure at locations in the non-overlapped and overlapped regions of the DSL structure aligned to underlying via contact regions, wherein etching of the partial via holes through the ILD layer is end pointed when reaching the first or second stress liner layer in the non-overlapped region and when reaching the second stress liner layer in the overlapped region of the DSL structure;

selectively etching portions of the second stress liner layer exposed through the partial via holes in the overlapped region of the DSL structure to extend the partial via holes in the overlapped region through the second stress liner layer down to the underlying first stress liner; and concurrently etching portions of the first and second stress liner layers exposed through the partial via holes in the overlapped and non-overlapped regions of the DSL structure to form contact via holes that expose the underlying device contact regions;

wherein selectively etching portions of the second stress liner layer exposed through the partial via holes in the overlapped region of the DSL structure comprises:

depositing sacrificial material to cover portions of the first or second stress liner layers exposed at the bottom of the partial via holes in the non-overlapped region of the DSL structure; and anisotropically etching the portions of the second stress liner layer exposed through the partial via holes in the overlapped region of the DSL structure using an etch chemistry in which the exposed portions of the second stress liner layer at the bottom of the partial via holes in the overlapped region is etched selective to the sacrificial material in the partial via holes in the non-overlapped region.

11. The method of claim 10, wherein the sacrificial material is an organic material.

12. The method of claim 10, wherein the sacrificial material is an inorganic material.

13. The method of claim 10, wherein the sacrificial material is a BARC material.

14. The method of claim 10, wherein depositing sacrificial material to cover portions of the first or second stress liner layers exposed at the bottom of the partial via holes in the non-overlapped region of the DSL structure comprises:

depositing a layer of sacrificial material over the ILD layer to fill the partial via holes in both overlapped and non-overlapped regions of the DSL structures with the sacrificial material, and etching back the layer of sacrificial material to a depth sufficient to remove the sacrificial material within the partial via holes in the overlapped region of the DSL structure.

15. The method of claim 14, wherein etching back the layer of sacrificial material is performed using a dry etch process with an etch chemistry that etches the sacrificial material selective to the material of the first and second stress liner layers.

16. A method for fabricating a semiconductor device, comprising:

forming a DSL (dual stress liner) structure on an active surface of a semiconductor substrate having first and second device regions, wherein the DSL structure comprises first and second stress liner layers formed over the first and second device regions, respectively, the DSL structure comprising an overlapped region in which a portion of the second stress liner layer overlaps a portion of the first stress liner layer at an interface between the first and second stress liner layers, and wherein the DSL structure comprise a non-overlapped region in which portions of the first and second stress liner layers are not overlapped;

forming an ILD (interlevel dielectric) layer over the DSL structure;

concurrently etching the underlying DSL structure at locations in the non-overlapped and overlapped regions of the DSL structure aligned to underlying via contact regions, wherein etching of the partial via holes through the ILD layer is end pointed when reaching the first or second stress liner layer in the non-overlapped region and when reaching the second stress liner layer in the overlapped region of the DSL structure;

selectively etching portions of the second stress liner layer exposed through the partial via holes in the overlapped region of the DSL structure to extend the partial via holes in the overlapped region through the second stress liner layer down to the underlying first stress liner; and concurrently etching portions of the first and second stress liner layers exposed through the partial via holes in the overlapped and non-overlapped regions of the DSL structure to form contact via holes that expose the underlying device contact regions;

wherein the overlapped region of the DSL structure is disposed over an isolation region between adjacent transistor devices.

17. The method of claim 16, wherein the partial via holes formed in the ILD layer in the overlapped region of the DSL structure are aligned to underlying contact regions of a silicided polysilicon line formed on the isolation layer.

18. The method of claim 10, wherein the partial via holes in the ILD layer in the non-overlapped region of the DSL structure are aligned to underlying contact regions of silicided diffusion regions or polysilicon gate electrodes of one or more of the transistor devices.

* * * * *